United States Patent
Schuele et al.

(10) Patent No.: US 7,419,858 B2
(45) Date of Patent: Sep. 2, 2008

(54) RECESSED-GATE THIN-FILM TRANSISTOR WITH SELF-ALIGNED LIGHTLY DOPED DRAIN

(75) Inventors: Paul J. Schuele, Washougal, WA (US); Mark A. Crowder, Portland, OR (US); Apostolos T. Voutsas, Portland, OR (US); Hidayat Kisdarjono, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 75 days.

(21) Appl. No.: 11/513,977

(22) Filed: Aug. 31, 2006

(65) Prior Publication Data
US 2008/0057649 A1     Mar. 6, 2008

(51) Int. Cl.
*H01L 21/84* (2006.01)
(52) U.S. Cl. .................. 438/163; 438/524; 438/589
(58) Field of Classification Search .......... 438/151, 438/163, 302, 307, 589, 524
See application file for complete search history.

(56) References Cited
U.S. PATENT DOCUMENTS

| | | | | |
|---|---|---|---|---|
| 5,670,398 A | * | 9/1997 | Yin et al. | 438/151 |
| 5,937,283 A | * | 8/1999 | Lee | 438/149 |
| 6,031,261 A | * | 2/2000 | Kang | 257/302 |
| 6,107,662 A | * | 8/2000 | Kim | 257/330 |
| 2005/0202605 A1 | * | 9/2005 | Koyama | 438/151 |

OTHER PUBLICATIONS

R. Izawa et al., "Impact of the Gate-Drain Overlapped Devices (GOLD) for Deep Submicrometer VLSI", IEEE Trans. Electron Devices 35, 2088 1988.

* cited by examiner

*Primary Examiner*—M. Wilczewski
*Assistant Examiner*—Toniae M. Thomas
(74) *Attorney, Agent, or Firm*—Law Office of Gerald Maliszewski; Gerald Maliszewski

(57) ABSTRACT

A recessed-gate thin-film transistor (RG-TFT) with a self-aligned lightly doped drain (LDD) is provided, along with a corresponding fabrication method. The method deposits an insulator overlying a substrate and etches a trench in the insulator. The trench has a bottom and sidewalls. An active silicon (Si) layer is formed overlying the insulator and trench, with a gate oxide layer over the active Si layer. A recessed gate electrode is then formed in the trench. The TFT is doped and LDD regions are formed in the active Si layer overlying the trench sidewalls. The LDD regions have a length that extends from a top of the trench sidewall, to the trench bottom, with a doping density that decreases in response to the LDD length. Alternately stated, the LDD length is directly related to the depth of the trench.

14 Claims, 11 Drawing Sheets

Fig. 9
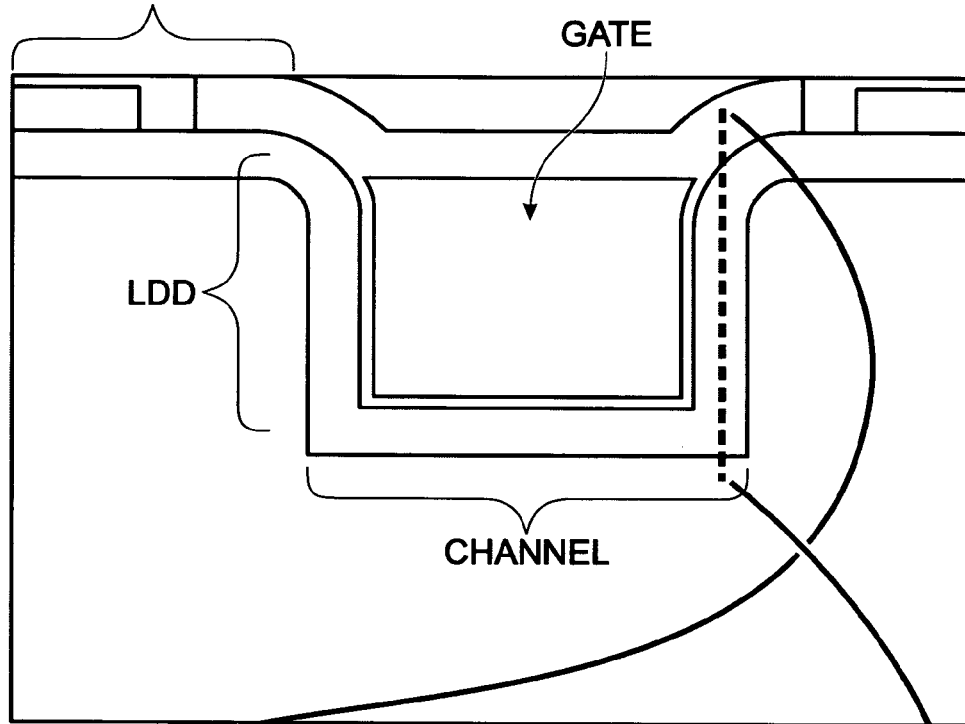
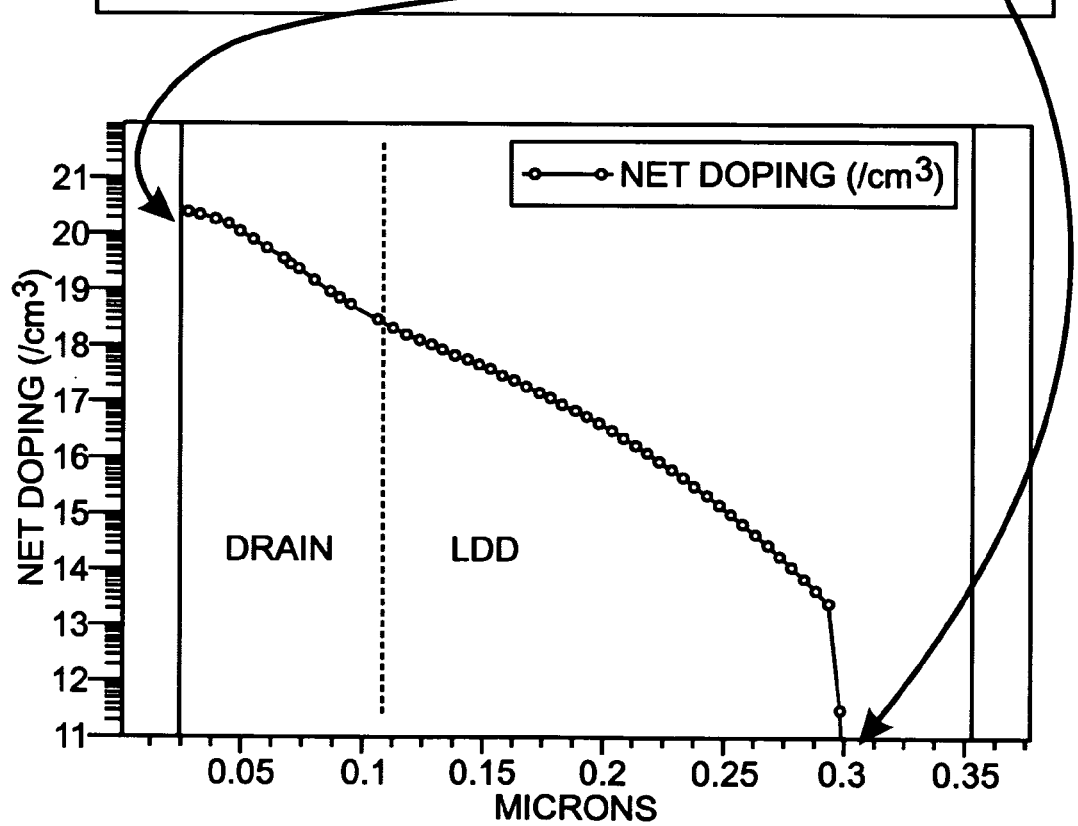

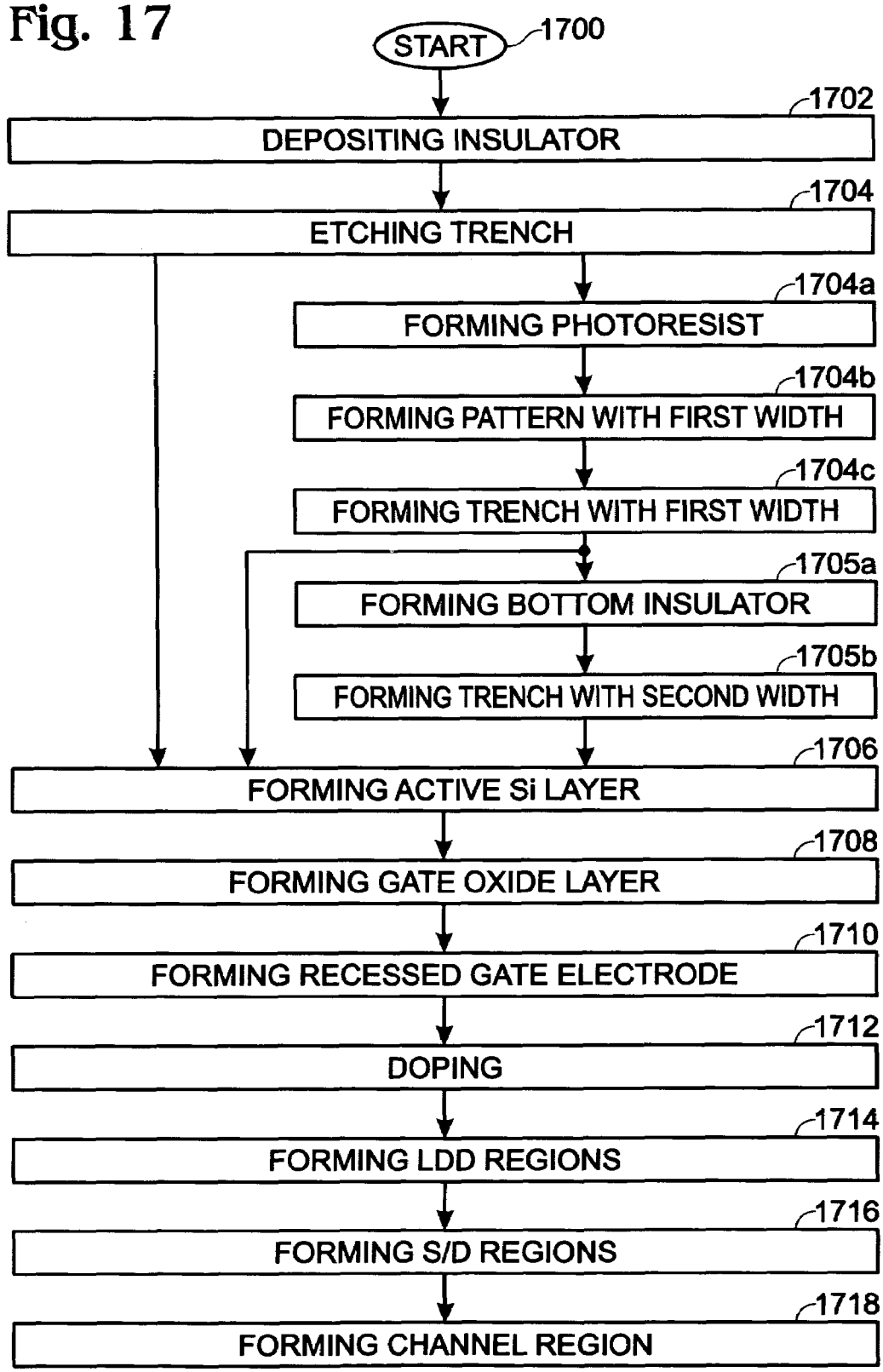

RECESSED-GATE THIN-FILM TRANSISTOR WITH SELF-ALIGNED LIGHTLY DOPED DRAIN

BACKGROUND OF THE INVENTION

1. Field of the Invention

This invention generally relates to integrated circuit (IC) fabrication and, more particularly, to a recessed-gate thin-film transistor (RG-TFT) having a self-aligned lightly doped drain (LDD).

2. Description of the Related Art

The integration of complex circuit functions such as drivers, serial-parallel converters, video decoders, and the like on the glass panels used for LCD displays requires very high performance TFT transistors. These TFTs must operate at supply voltages of 5 V and below, to increase operating speed and decrease power consumption. MOSFET transistor performance is expressed in terms of switching speed or gate delay, and performance can be increased by decreasing operating voltage, gate oxide thickness, or channel length (Leff), increasing transistor drive current while decreasing the parasitic capacitances associated with the transistor structure. Devices with performance sufficient to meet the needs of advanced circuits operating at 5 V typically have gate lengths less than 1 micrometer (um) and gate oxide thickness below 15 nanometers (nm). An important side effect of decreasing transistor gate length and gate oxide thickness is the increase in field strength that occurs at the edge of the gate electrode adjacent to the drain. This increased field leads to several undesirable effects such as Vt roll-off, hot carrier injection, and drain induced barrier lowering (DIBL), which are generally referred to as short channel effects or SCE. An additional unfavorable effect that is applicable to fully depleted SOI and thin film transistors is the kink effect which causes high current instability for NMOS transistors.

FIG. 1 is a cross-sectional view of a TFT and a graph of current v. voltage (I-V) illustrating the kink effect at a high drain voltage (prior art). The kink effect is caused by the following chain of events. A high field is generated at the gate—drain edge, due to the applied voltages Vd and Vg, causing hot carrier injection, which in turn, generates electron-hole pairs. The field between source and drain moves holes to the source junction where they are trapped between the source junction and the substrate. The pile up of holes leads to a decrease in potential at the source edge of the gate, which has the effect of decreasing the channel length and increasing current. If the effect is severe, this current increase can lead to thermal cascade, melting, and failure of the device.

FIG. 2 is a partial cross-section of a TFT device and a simulation of the magnitude of the electric field under the gate for different device architectures (prior art). One widely-used strategy for improving short channel effects is to use lower doping at the edge of the MOSFET gate, as compared to the source/drain doping, in order to decrease the magnitude of the maximum field. Simulations of three approaches (Double Diffused Drain, Lightly Doped Drain, and gate overlapping Drain) are shown (from R. Izawa et al., "Impact of the Gate-Drain Overlapped Devices (GOLD) for Deep Submicrometer VLSI", IEEE Trans. Electron Devices 35, 2088 1988). The Double Diffused Drain architecture is not appropriate for liquid crystal display (LCD) fabrication because the process flow requires a very high temperature anneal to diffuse arsenic and phosphorus dopants at different rates. Both the LDD and GOLD architectures have been used for fabrication of TFT devices on glass substrates, and they are described briefly below.

FIG. 3 shows partial cross-sectional views of a transistor, depicting steps in the fabrication of an LDD structure formed with spacers (prior art). The use of a Lightly Doped Drain (LDD) structure to decrease the field intensity at the edge of the gate and improve short channel effects is well known in conventional CMOS processing. A schematic summary of the process of forming a device with an LDD structure is shown. Briefly, the process flow is as follows. After patterning the gate electrode, a low dose N or P type implant forms the LDD region. The implant density is typically about 1 to 3e13 $cm^{-2}$, and the dopant is self-aligned with the gate electrode. A dielectric such as $SiO_2$ or a composite layer of $SiO_2$ and $Si_3N_4$ is deposited as a conformal layer over the gate and etched anisotropically to form spacers. The source and drain regions are doped with a high dose N or P type implant (typically implant density is about 1 to 7e15 $cm^{-2}$), and the spacers protect the LDD region from the source/drain implant. In this case, the width of the LDD region is determined by the spacer width.

Thus, the LDD region has a higher resistance than the source/drain regions, and the voltage drop between drain and gate is spread over a larger distance than it would be if the junction between drain and channel regions were abrupt. In this way, the maximum field is decreased and short channel effects are decreased. Other methods are also known for forming lateral offsets between LDD and S/D implant.

FIG. 4 shows partial cross-sectional views of a transistor, depicting steps in the fabrication of a TFT using a GOLD process (prior art). A technique similar to the LDD approach, which has been used on TFT devices with long channels, is the Gate-Overlapping-Drain or GOLD process, which uses a medium dose implant prior to gate deposition to form a lightly doped drain region under the gate edge. Briefly, the process flow is as follows. Photoresist is patterned to protect the active silicon layer where the transistor channel is to be formed. An ion implant with a low dose of N (for NMOS transistor) or P (for PMOS transistor) type dopant forms the GOLD region. The implant density is typically about 1 to 9e13 $cm^{-2}$. The position of the photoresist pattern with respect to the gate electrode determines the GOLD region width, so the GOLD process is not self-aligned. The gate dielectric (typically CVD $SiO_2$) is deposited followed by the gate electrode, which may be doped polysilicon or a metal such as WTa, and the gate is patterned. The source and drain regions are doped with a high dose N or P type implant (typically implant density is about 1 to 7e15 $cm^{-2}$). The gate electrode protects the GOLD region from the source/drain implant, so the width of the GOLD region is determined by the overlap between the gate edge and the GOLD implant edge.

All of the LDD formation techniques based on the use of a spacer suffer from variations in dopant due to the changes in thickness and step coverage of the spacer layer, and especially in the amount of over etch and the degree of isotropic etching in the spacer etch. In addition, the width of the spacer is limited to being less than the height of the gate stack used to form the edge of the spacer. If a wider spacer is required for high voltage devices, it is not practical to increase the gate electrode thickness.

The GOLD technique is limited by the resolution of lithography used for LCD panel fabrication and by the amount of overlay matching between the GOLD photo pattern and the gate patterning. For current fabrication methods the resolution limits for a step is about 1 um. Overlay matching, particularly across the very large glass substrates used for LCD panel fabrication, is very difficult and the variation in GOLD width due to differences in placement between the gate and GOLD layers may be as much as 1 um. As a consequence, the GOLD technique can only be used for long channel devices with gate lengths of about 4 um. The GOLD technique is not suitable for controlling SCE in high performance devices with sub-micron gate lengths.

It would be advantageous if a device structure and corresponding process existed for producing an LDD region with a well controlled LDD width in a single ion doping step, self-aligned to the gate, and suitable for sub-micron gate lengths.

SUMMARY OF THE INVENTION

The present invention uses an anisotropic etch process to form a recessed (top) gate TFT in a trench that has been etched into a base coat insulator. The device is formed in a manner similar to conventional planar TFT devices, except that a trench is etched in the substrate prior to fabrication, so the device is formed with source/drain regions on the surface. LDD regions extend down the sidewalls of the trench and the channel runs across the bottom of the trench. This device can be fabricated quite simply using a single ion doping step. The high dose implant forms the shallow source/drain regions, and a long doping tail characteristic of the ion doping process forms the LDD regions. The gate electrode blocks dopant in the channel region and the depth of the trench etch is chosen to provide a suitable LDD width. This approach provides simple control of the LDD distance, as compared to the spacer approach, which is limited by the height of the gate stack and is subject to variability induced by the spacer deposition and etch processes. An additional benefit of this device compared to other 3-D device architectures is that the final surface is nearly planar, which improves interconnect step coverage and simplifies interconnect etching.

Accordingly, a method is provided for fabricating a recessed-gate thin-film transistor (RG-TFT) with a self-aligned lightly doped drain (LDD). The method deposits an insulator overlying a substrate and etches a trench in the insulator. The trench has a bottom and sidewalls. An active silicon (Si) layer is formed overlying the insulator and trench, with a gate oxide layer over the active Si layer. A recessed gate electrode is then formed in the trench overlying the gate oxide layer. The TFT is doped and LDD regions are formed in the active Si layer overlying the trench sidewalls.

The LDD regions have a length that extends from a top of the trench sidewall, to the trench bottom, with a doping density that decreases in response to the LDD length. Alternately stated, the LDD length is directly related to the depth of the trench. In one aspect, the insulator includes a silicon dioxide layer with a thickness overlying a silicon nitride layer. The trench is etched through the silicon dioxide, stopping at the silicon nitride, making LDD length responsive to the silicon dioxide thickness.

In another aspect, source/drain (S/D) regions are formed simultaneously with the LDD regions, as the result of a single step of TFT doping. Likewise, a channel region can be formed in the active Si layer overlying the trench bottom, simultaneously with the S/D and LDD regions, in response to a single step of doping. Alternately, the S/D and LDD regions can be formed in multiple implantation steps.

Additional details of the above-described method and a RG-TFT device with a self-aligned LDD region are presented below.

BRIEF DESCRIPTION OF THE DRAWINGS

FIG. 9 is a cross-section view and graph depicting the doping density profile resulting from a single-step implantation process.

FIG. 17 is a flowchart illustrating a method for fabricating a RG-TFT with a self-aligned LDD.

DETAILED DESCRIPTION

Figure 1:
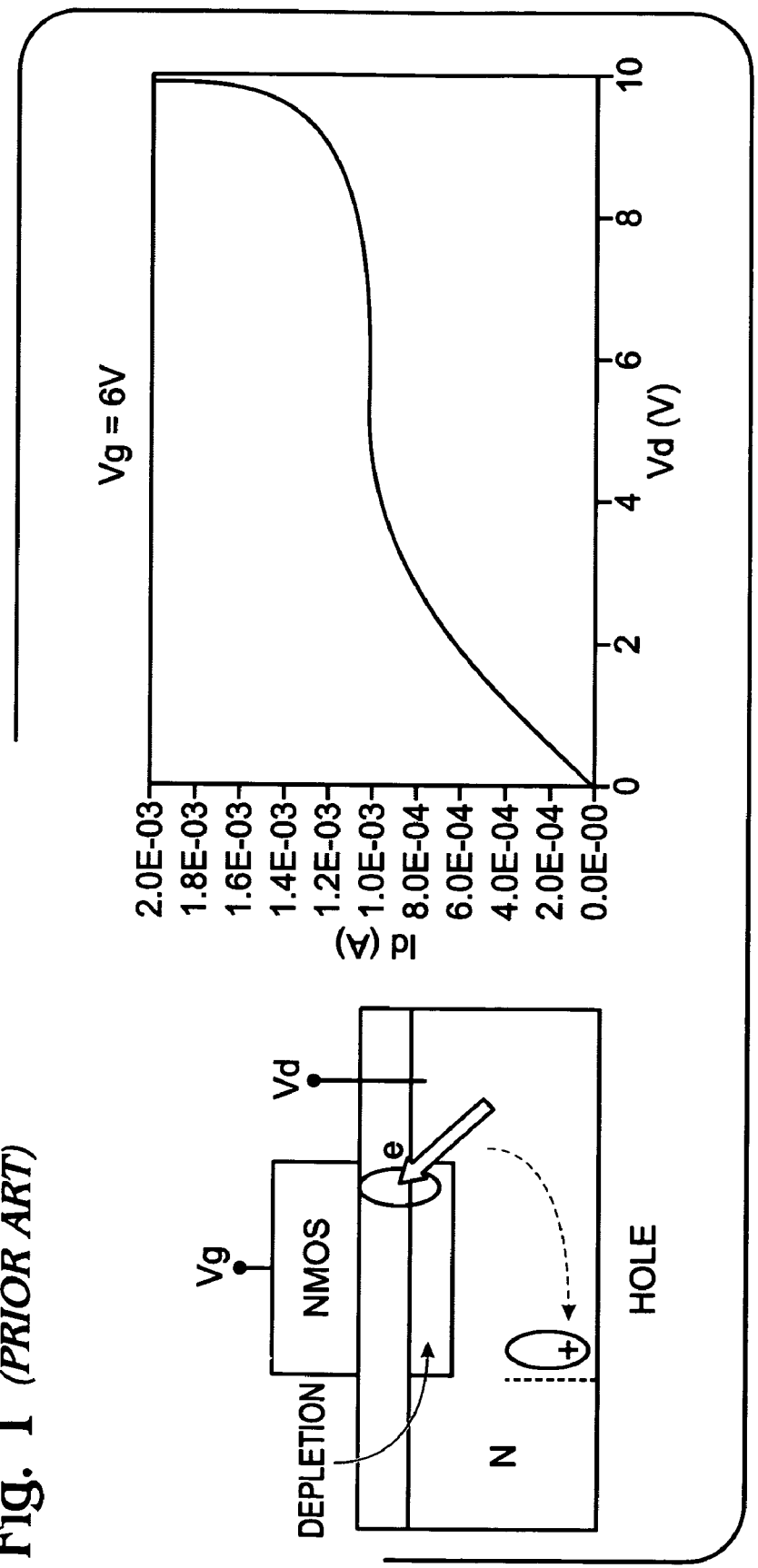
FIG. 1 is a cross-sectional view of a TFT and a graph of current v. voltage (I-V) illustrating the kink effect at a high drain voltage (prior art).
Figure 2:
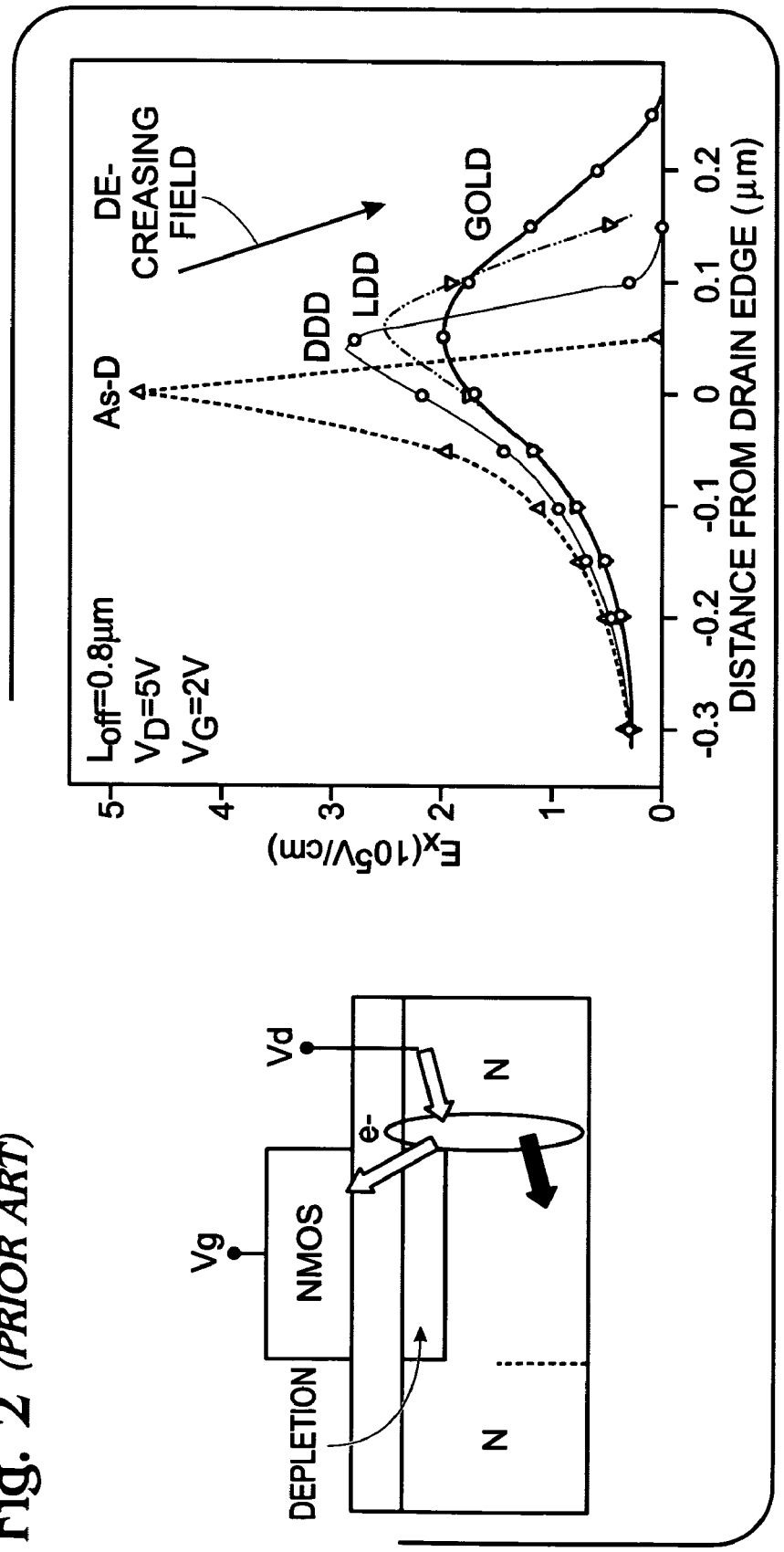
FIG. 2 is a partial cross-section of a TFT device and a simulation of the magnitude of the electric field under the gate for different device architectures (prior art).
Figure 3:
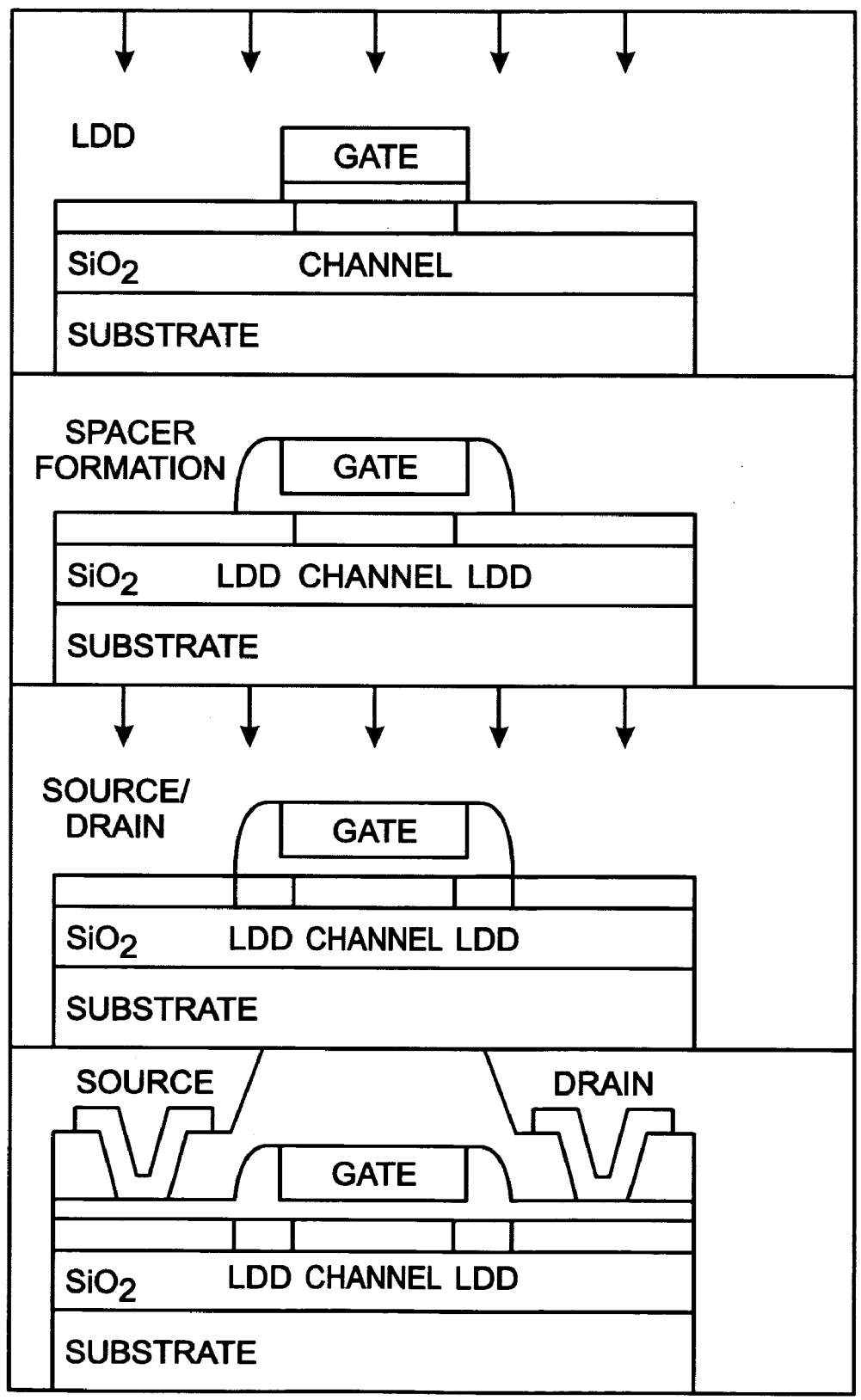
FIG. 3 shows partial cross-sectional views of a transistor, depicting steps in the fabrication of an LDD structure formed with spacers (prior art).
Figure 4:
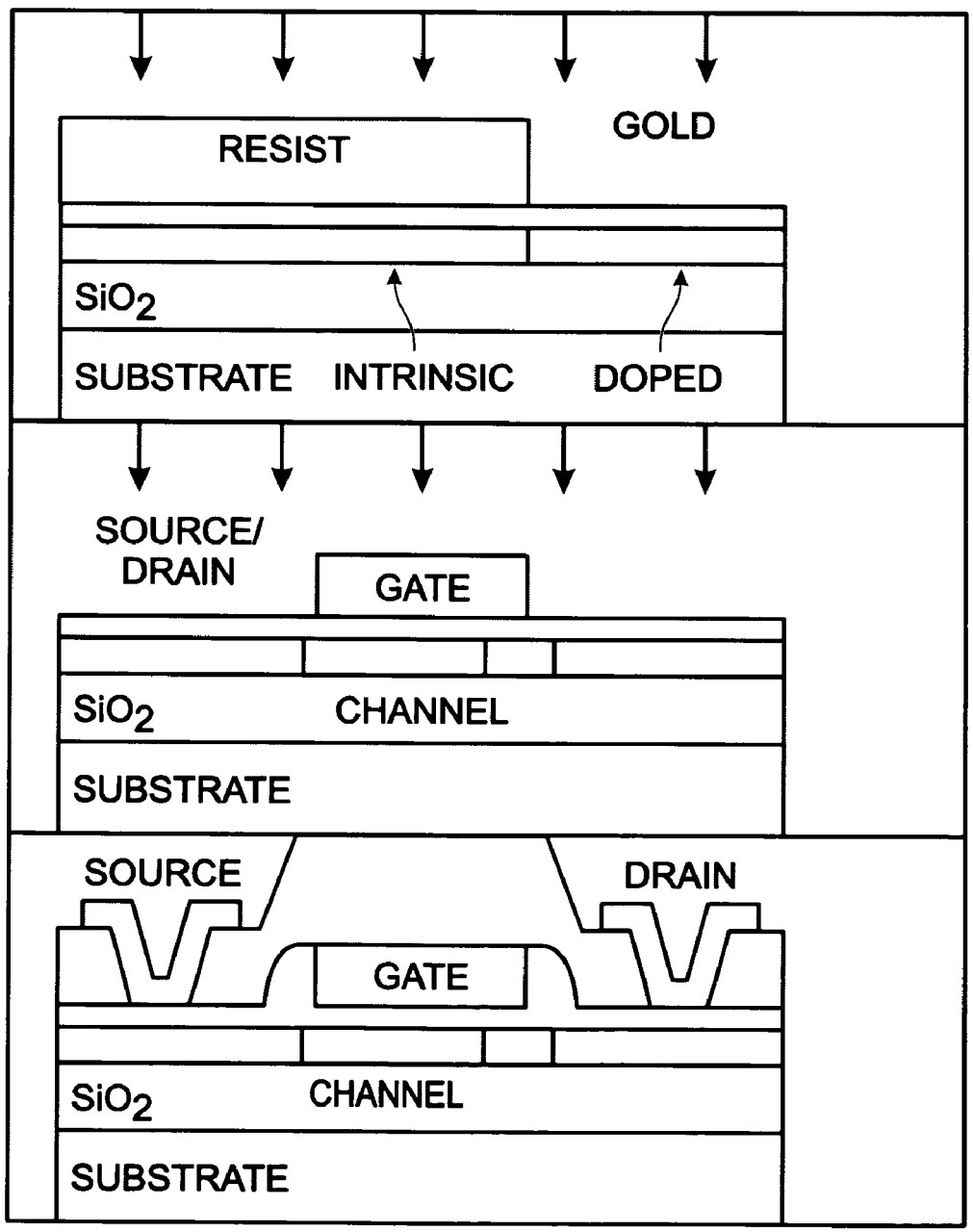
FIG. 4 shows partial cross-sectional views of a transistor, depicting steps in the fabrication of a TFT using a GOLD process (prior art).
Figure 5:
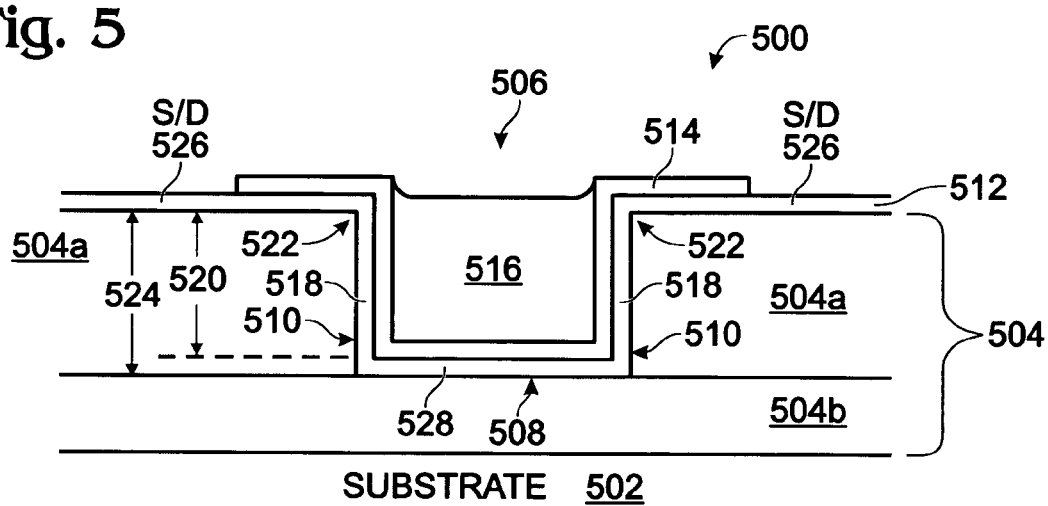
FIG. 5 is a partial cross-sectional view of a recessed-gate thin-film transistor (RG-TFT) with a self-aligned lightly doped drain (LDD).

FIG. 5 is a partial cross-sectional view of a recessed-gate thin-film transistor (RG-TFT) with a self-aligned lightly doped drain (LDD). The RG-TFT 500 comprises a substrate 502 of a material such as single-crystal silicon, quartz, glass, or plastic. An insulator 504 overlies the substrate 502. The insulator 504 can be silicon oxide, a stack of silicon dioxide 504a and silicon nitride 504b (as shown), or a high-k dielectric material. A trench 506 is formed in the insulator 504, having a bottom 508 and sidewalls 510. An active silicon (Si) layer 512 overlies the insulator 504 and trench 506. A gate oxide layer 514 overlies the active Si layer 512, and a recessed gate electrode 516 is formed in the trench 506 overlying the gate oxide layer 514. LDD regions 518 are formed in the active Si layer 512 overlying the trench sidewalls 510.

The LDD regions 518 have a length 520 that extends from the top 522 of the trench sidewalls 510, to the trench bottom 508. As explained in more detail below, the LDD regions 518 have a doping density that decreases in response to the LDD length 520. That is, the density of dopant in the LDD regions 518 is less near the trench bottom 508, than it is at the sidewall top 522.

The silicon dioxide layer 504a has a thickness 524. The trench sidewalls 510 are formed in the silicon dioxide 504a, and the trench bottom 508 is formed on the silicon nitride 504b. Thus, the LDD regions 518 have a length 520 responsive to the silicon dioxide thickness 524. In some aspects, it can be said that the LDD length 520 is the same as the silicon dioxide thickness 524.

The active Si layer 512 is formed overlying the insulator 504, adjacent the LDD regions 518. Source/drain (S/D) regions 526 are formed in the active Si layer 512 adjacent the LDD regions 518. Typically, the S/D regions 526 have a doping density greater than the LDD regions 518, as is conventional. A channel region 528 is formed in the active Si layer 512 overlying the trench bottom 508.

Figure 6:
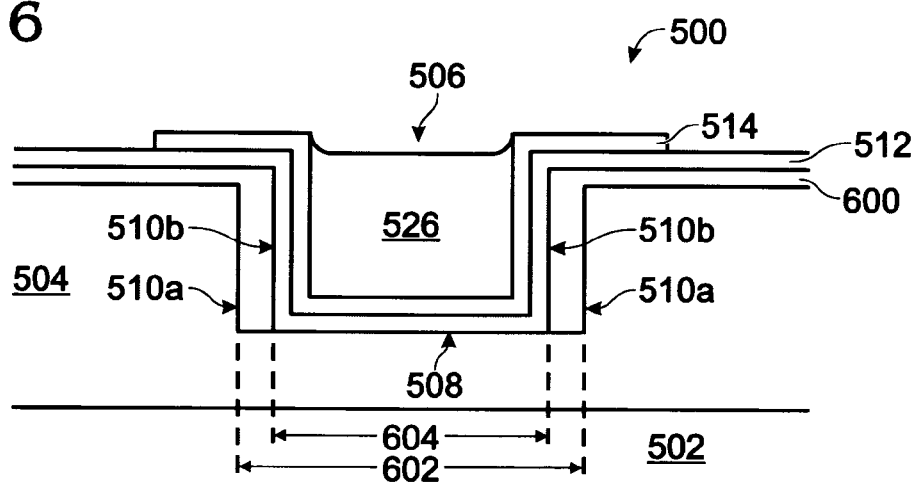
FIG. 6 is a partial cross-sectional view depicting a first variation of the RG-TFT of FIG. 5.

FIG. 6 is a partial cross-sectional view depicting a first variation of the RG-TFT of FIG. 5. In this aspect, a bottom insulator layer 600 is interposed between the trench 506 and the active Si layer 512. More explicitly, the bottom insulator 600 is interposed between the active Si layer 512 and the trench bottom 508, and interposed between the active Si layer 512 and the trench sidewalls 510. The trench 506 has a first width 602 between trench sidewalls 510a formed by the insulator 504, and a second width 604, smaller than the first width 602, between trench sidewalls 510b formed by the bottom insulator 600. Note, in this aspect, the insulator 504 may be silicon dioxide.

Figure 7:
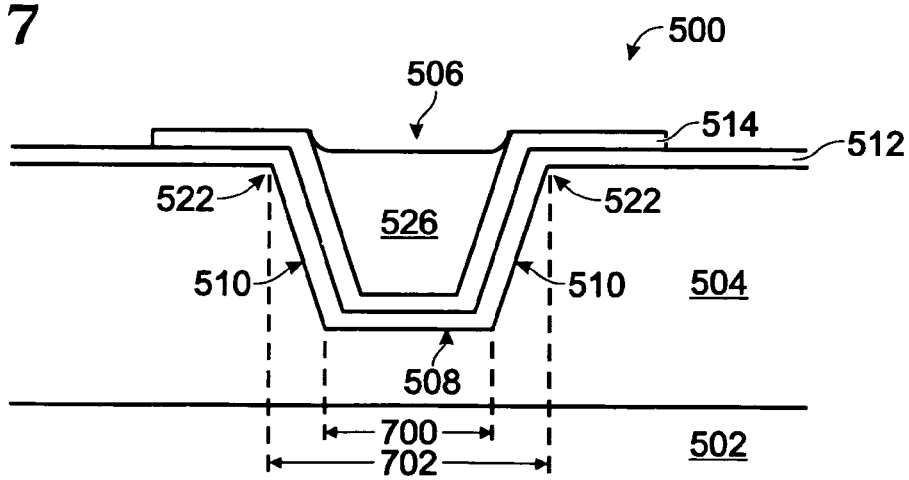
FIG. 7 is a partial cross-sectional view depicting a second variation of the RG-TFT of FIG. 5.

FIG. 7 is a partial cross-sectional view depicting a second variation of the RG-TFT of FIG. 5. In this aspect, the trench 506 has a first width 700 at the trench bottom 508 and a third width 702, greater than the first width 700, between the trench sidewall tops 522. Alternately stated, the trench sidewalls need not be vertical. Although sidewalls 510 are shown at an angle of about 45 degrees with respect to the trench bottom 508, the TFT is not necessarily limited to any particular angle.

Functional Description

Figure 8:
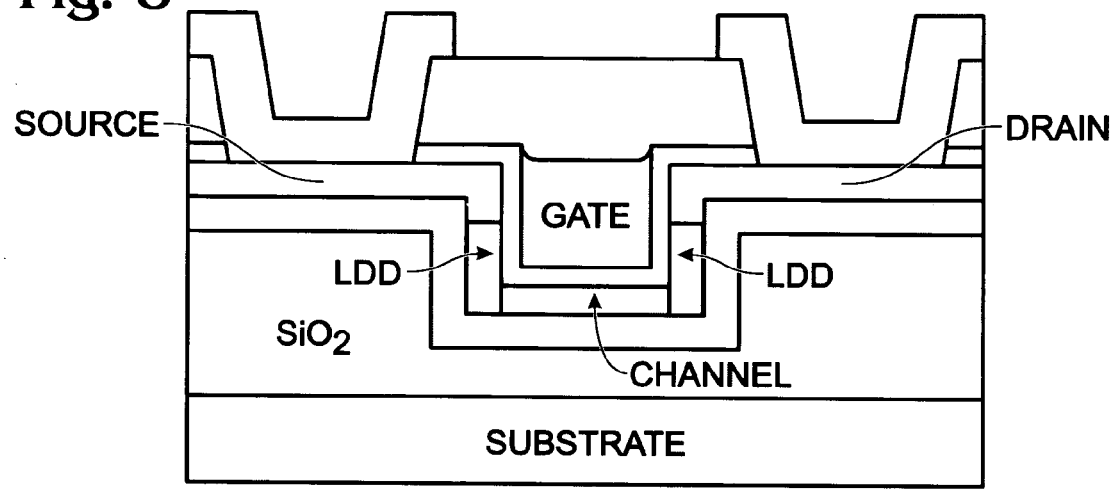
FIG. 8 is a partial cross-sectional view more simply depicting the RG-TFT of FIG. 5.

FIG. 8 is a partial cross-sectional view more simply depicting the RG-TFT of FIG. 5. An anisotropic etch process forms a recessed-gate TFT in a trench, which has been etched in a base coat insulator. The device is formed in a manner similar to conventional planar TFT devices, except that a trench is etched in the insulator prior to fabrication, so the device is formed with source/drain regions on the surface. LDD regions extend down the sidewalls of the trench and the channel runs across the bottom of the trench.

FIG. 9 is a cross-section view and graph depicting the doping density profile resulting from a single-step implantation process. The doping concentration is graphed on the right side of the drawings, referenced to the "cut line" marked in the cross-sectional view. This device can be fabricated quite simply using a single ion doping step because the high dose implant forms the shallow source/drain regions, and the long doping tail characteristic of the ion doping process forms the LDD regions. The gate electrode blocks dopant in the channel region, and the depth of the trench etch is chosen to provide a suitable LDD width. This approach provides simpler and more effective control over the LDD length, when compared to the spacer approach of a conventional LDD process, which is limited by the height of the gate stack and is subject to variability induced by the spacer deposition and etch processes.

Figure 10:
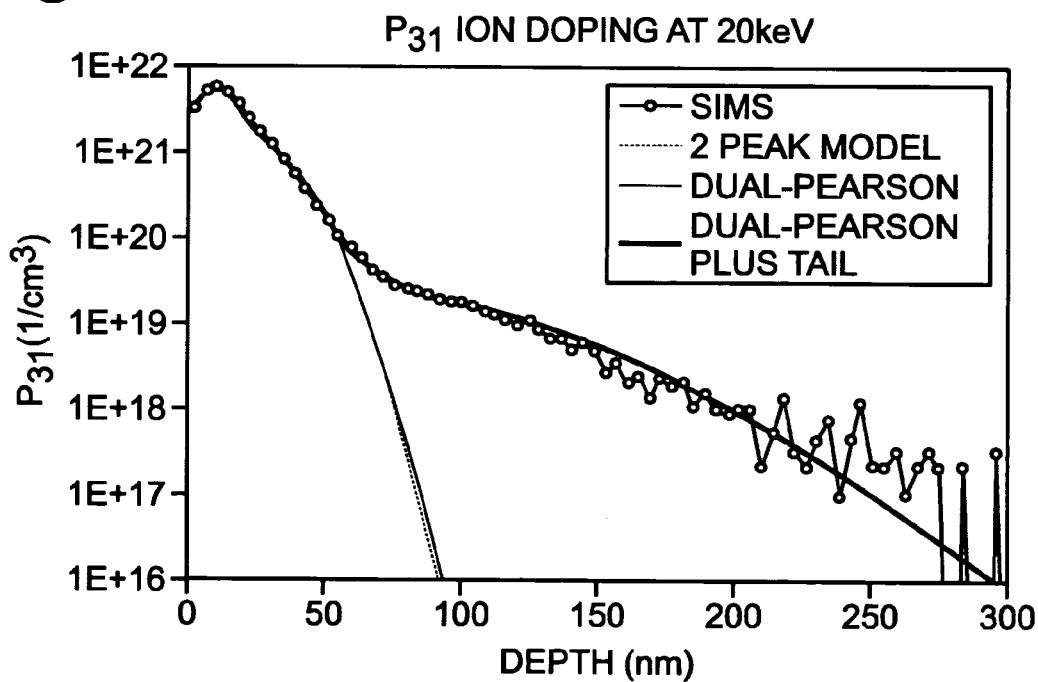
FIG. 10 is a graph depicting an ion doping profile.

FIG. 10 is a graph depicting an ion doping profile. An exemplary ion doping tool used for ion implantation in LCD Display manufacturing produces a doping profile with the depth shown in the figure. It can be seen that there is a secondary doping concentration that extends significantly deeper than the high density primary peak used for source/drain doping.

The layer over the gate is a screening oxide (see FIG. 9), which may be used to tune the depth of the implant in the source/drain region. The thickness of the screening oxide layer is tuned to get the peak of the S/D implant at the top surface of the source/drain, using a reasonable implant energy. The screening oxide also protects the surface from contamination. The doping implants may also be performed without screen oxide.

In this example (using the screen oxide), the gate is etched, stopping on Si, following after gate deposition. A 300 Å thick screen oxide is deposited. Implanting is performed, to form LDD and S/D regions at the same time. The screen oxide to the left and right sides of the gate are etched to form contacts. The regions with the highest doping density occur in the screen oxide and S/D active silicon regions.

FIGS. 11 through 16 depict steps in the fabrication of a RG-TFT device. The RG-TFT device uses many conventional processing methods already used to fabricate planar TFT transistors for LCD displays, to form a TFT device with a unique vertical LDD region. A detailed exemplary process flow of the device fabrication is as follows:

On a transparent substrate, deposit plasma-enhanced chemical vapor deposition (PECVD) $SiO_2$ between 100 nm and 1 um thick. This layer should be at least as thick as the length of the transistor LDD region. Alternately, a two-layer insulating stack can be deposited on the substrate so that a subsequent trench etch has a stop layer to control trench depth. For the stop layer, deposit PECVD $Si_3N_4$ between 20 nm and 100 nm thick on the substrate, followed by deposition of PECVD $SiO_2$ between 100 nm and 1 um thick. The $SiO_2$ layer thickness determines the length of the transistor LDD region.

Figure 11:
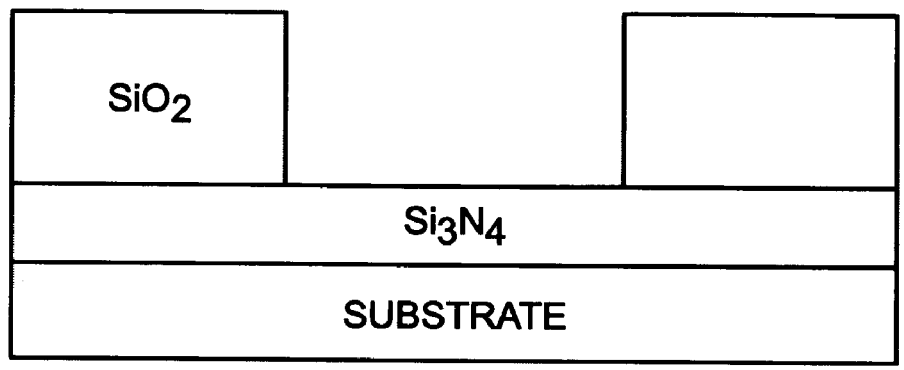
FIGS. 11 through 16 depict steps in the fabrication of a RG-TFT device.

A dark field photoresist pattern is exposed with openings where the gate electrode is to be formed. The oxide layer is etched to the correct depth to form an LDD region of the desired length as shown in FIG. 11.

Figure 12:
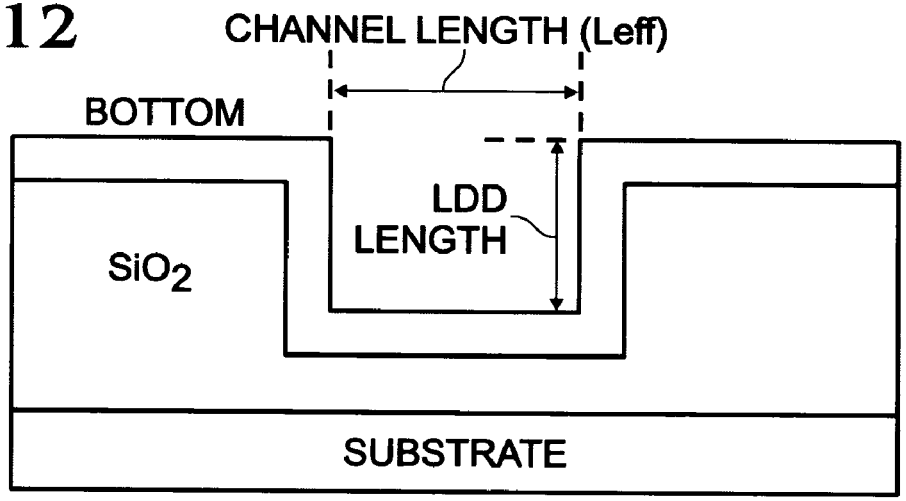

If transistor channel lengths are desired that are smaller than the minimum width pattern available through photolithography, the channel length (Leff) can be decreased by depositing a PECVD $SiO_2$ bottom insulator layer, thereby decreasing the width of the trench as shown in FIG. 12. The bottom oxide layer also is useful for rounding the top corner of the trench feature. If a nitride stop layer is used, the bottom oxide provides a single surface type for the following silicon deposition.

Figure 13:
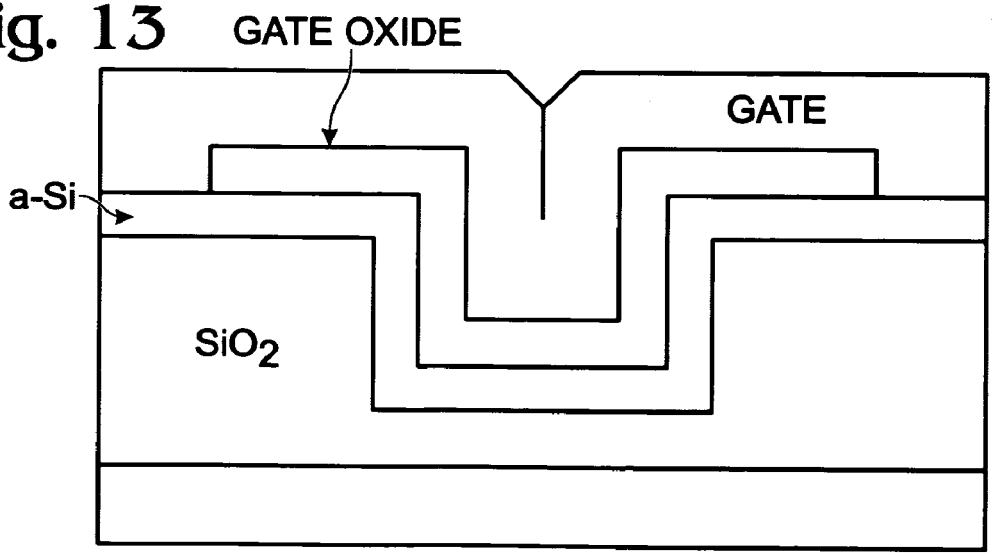

Conformally deposit an amorphous Si (a-Si) layer 30 to 100 nm thick, which will be the active layer for the transistors. The a-Si layer may optionally be crystallized using laser annealing methods, to produce high mobility active silicon. Pattern and etch the crystallized Si layer, to form active islands which are isolated from each other. Deposit a gate insulating layer, which may be $SiO_2$, $SiO_2$ plus $Si_3N_4$, or a high dielectric constant material, 10 to 100 nm thick. Deposit a gate electrode layer, which may be PECVD Poly Si or an appropriate metal such as tungsten, between 300 nm and 1 um thick. This layer may fill the trench opening as is shown in FIG. 13.

Figure 14:
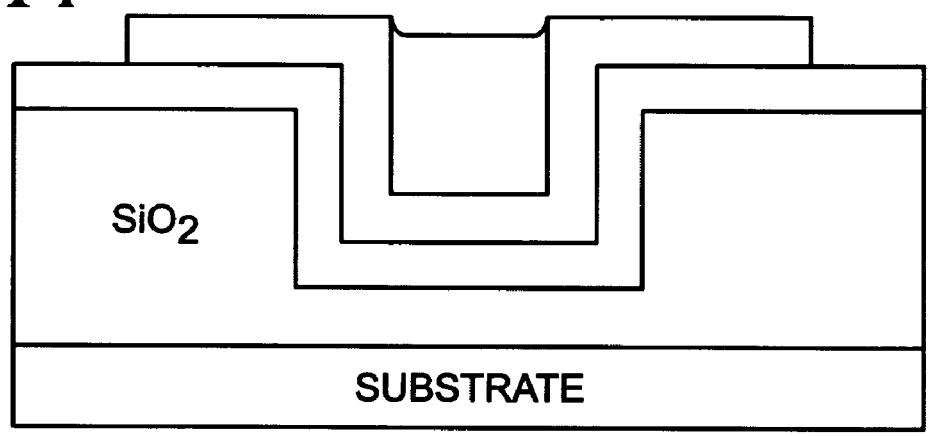

The gate electrode is patterned using an anisotropic etch, leaving the electrode only in the trench region. If all devices on the substrate are formed using the trench feature, the gate electrode patterning step can be carried out without photolithography. Optionally, conventional planar TFT's can be included by adding photo patterning before the gate-etch. The pattern after gate-etch is shown in FIG. 14.

P-channel metal-oxide-semiconductor (PMOS) devices are covered with photoresist, and the N+ source/drain regions are implanted with phosphorus or arsenic at a dose between 1e15 and 7e15, and energy between 5 and 25 keV. N-channel MOS (NMOS) devices are covered with photoresist and the P+ source/drain regions are implanted with boron at a dose between 1e15 and 7e15, and energy between 5 and 25 keV. Process simulation of the resulting doping profile for a device formed using the method of the current invention shows that the doping of the vertical LDD region is lower than the source/drain region. The LDD region has a controllable length over which the gate to drain field is distributed. In effect, this is a self-aligned GOLD region, which is not limited either by overlay or lithographic resolution.

Figure 15:
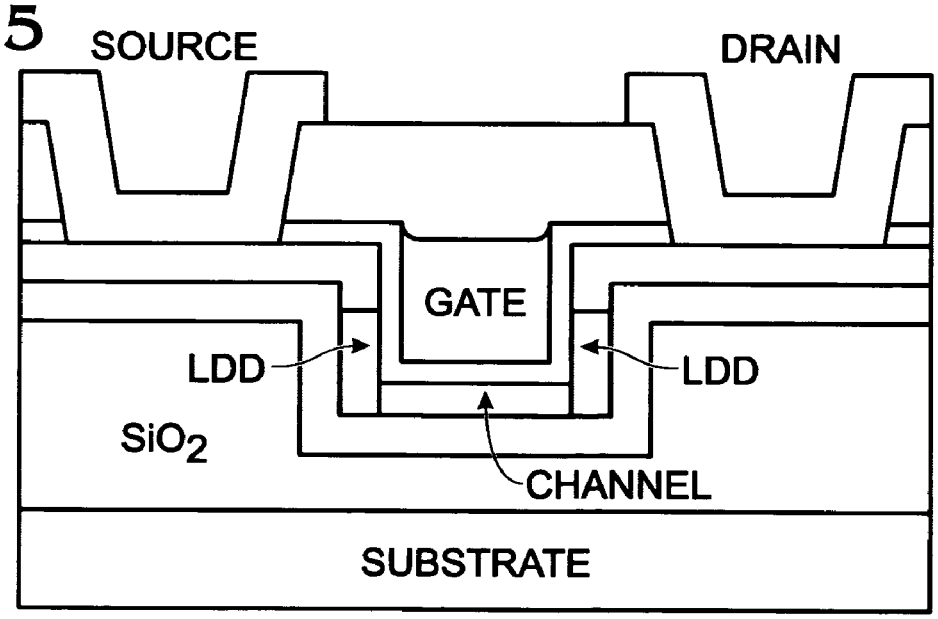

The RG-TFT devices may be completed using conventional TFT process flow by laser, furnace, or rapid thermal annealing (RTA) to activate the dopants. An inter-level dielectric (ILD) can be deposited and etched for contact openings. Then, a metal interconnect layer is deposited and patterned. The final structure, with contacts and interconnects, is shown in FIG. 15.

Figure 16:
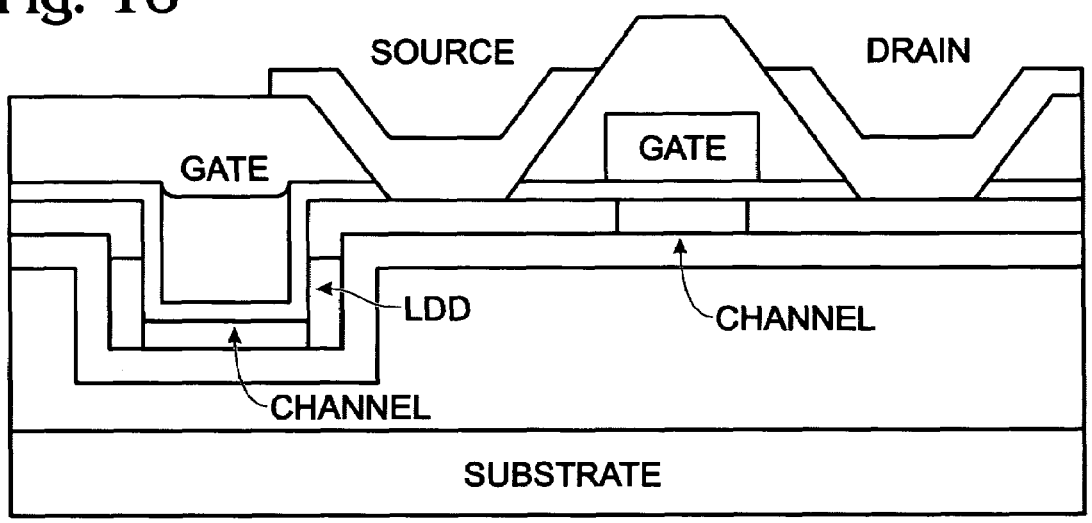

The RG-TFT is shown in FIG. 16 with a conventional planar TFT produced by a photo pattern in the gate-etch step. The co-integration process flow can be used to produce planar long channel devices without LDD regions, which have low leakage applications, while the short channel devices can be fabricated using the trench structure when high speed is important.

FIG. 17 is a flowchart illustrating a method for fabricating a RG-TFT with a self-aligned LDD. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 1700.

Step 1702 deposits an insulator overlying a substrate. The insulator may be silicon dioxide, a silicon dioxide/silicon nitride stack, or a high-k dielectric material. Step 1704 etches a trench in the insulator, having a bottom and sidewalls. Step 1706 forms an active Si layer overlying the insulator and trench. Step 1708 forms a gate oxide layer overlying the active Si layer. Step 1710 forms a recessed gate electrode in the trench overlying the gate oxide layer. Step 1712 dopes the TFT. Step 1714 forms LDD regions in the active Si layer overlying the trench sidewalls, in response to the doping.

In one aspect, forming LDD regions in Step 1714 includes forming LDD regions having a length that extends from a top of the trench sidewall, to the trench bottom. In another aspect, the LDD regions have a doping density that decreases in response to the LDD length. For example, if Step 1702 forms an insulator having a silicon dioxide layer, with a thickness, overlying a silicon nitride layer, then Step 1704 etches the trench through the silicon dioxide, stopping at the silicon nitride. Step 1714 forms LDD regions with a length responsive to the silicon dioxide thickness.

Forming the active Si layer in Step 1706 includes depositing an active Si layer overlying the insulator, adjacent the LDD regions. In one aspect, Step 1716 forms S/D regions in the active Si layer adjacent the LDD regions, simultaneous with forming the LDD regions (Step 1714), in response to doping the TFT (Step 1712). Typically, the S/D regions have a doping density greater than the LDD region doping density. Likewise, Step 1718 forms a channel region in the active Si layer overlying the trench bottom, simultaneous with forming the LDD regions (Step 1714), in response to the doping. In these aspects, Step 1712 is typically a single-implantation step.

In an alternate aspect, doping the TFT in Step 1712 includes a first implantation of dopant using a first energy. Then, Step 1716 forms S/D regions in response to the first implantation. Following Step 1716, Step 1712 includes a second implantation of dopant using a second energy, greater than the first energy. Then, Step 1714 includes forming LDD regions in response to the second implantation. More explicitly, a screen oxide is deposited, the thickness of which affects the depth of both implants. The first implantation is a shallow, high dose S/D implant. The second implant is a deep, lower dose LDD implant. The S/D properties are dominated by the S/D implant because the dose is very much higher. The LDD implant has only a slight effect on the S/D resistance. Therefore, the two implants can each be associated with a different (LDD or S/D) region.

In other aspects, a very low dose channel implant may be performed to adjust Vt. For standard CMOS devices there may be as many as five different channel implants, for different kinds of devices. In the case of TFT's used in liquid crystal displays (LCDs), there is a blanket channel implant conventionally performed before laser crystallization of the active Si layer, which increases the threshold voltage of both N and P TFT's. The same process may be performed when fabricating a RG-TFT. For example, a channel Vt implant dose might be around 1-3e12, where the LDD implant may be 2-5e13 and the S/D implant 1-7e15. In this aspect, the channel doping is performed before the deposition of the gate electrode in Step 1710.

Etching the trench in Step 1704 typically includes the following substeps. Step 1704a forms a photoresist layer overlying the insulator. Step 1704b forms a pattern in the photoresist having a first width, and Step 1704c etches a trench having the first width in response to the pattern. In one aspect of the method, Step 1705a forms a bottom insulator layer, prior to forming the active Si layer (Step 1706). Then, Step 1705b forms a trench second width, smaller than the first width, in response to the bottom oxide layer.

In a different aspect, Step 1704 etches a trench having the first width at the trench bottom and a third width, greater than the first width, between tops of the trench sidewalls (see FIG. 7).

Figure 18:
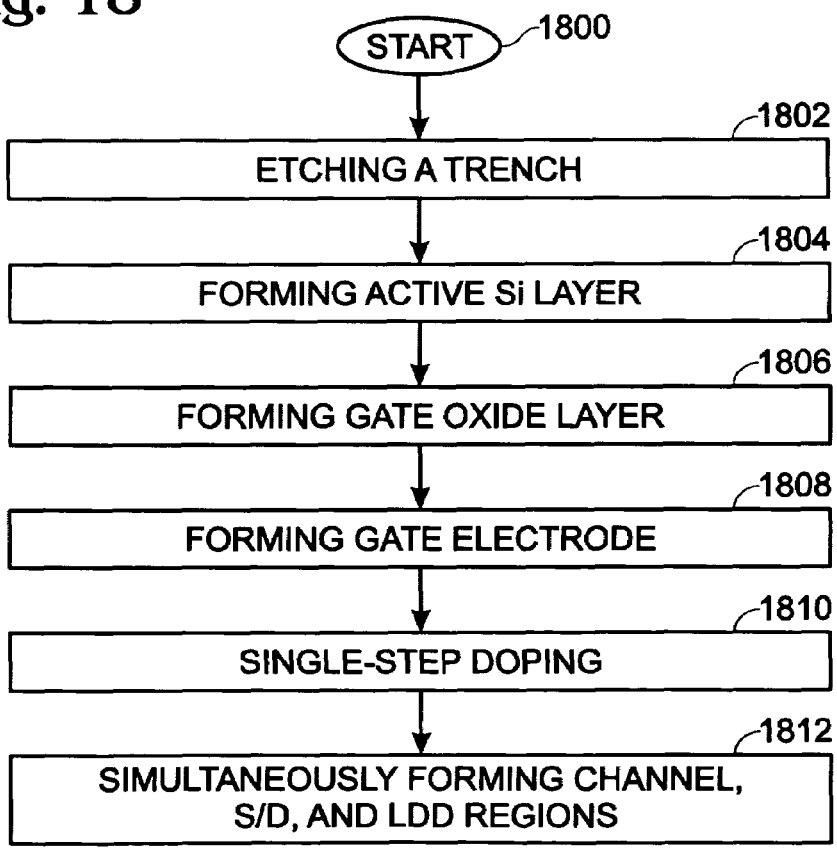
FIG. 18 is a flowchart illustrating a method for fabricating a TFT with a single step of dopant implantation.

FIG. 18 is a flowchart illustrating a method for fabricating a TFT with a single step of dopant implantation. The method begins at Step 1800. Step 1802 etches a trench in an insulator. Step 1804 forms an active Si layer overlying the insulator and trench. Step 1806 forms a gate oxide layer overlying the active Si layer. Step 1808 forms a gate electrode in the trench overlying the gate oxide layer. More explicitly, a material such as polycrystalline Si or a metal is deposited that is subsequently processed to become a gate electrode. Step 1810 dopes the TFT in a single implantation step. In response to the single-step doping, Step 1812 simultaneously forms heavily doped, source/drain (S/D), lightly doped drain (LDD), and undoped (intrinsic) channel regions. If the gate is a polySi material, then Step 1812 also simultaneously forms a doped gate, while forming the channel, S/D, and LDD regions.

In one aspect, Step 1802 forms a trench having sidewalls and a bottom. Then, Step 1812 forms a channel in the active Si layer, interposed between the gate electrode and the trench bottom. Likewise, Step 1812 forms LDD regions in the active Si layer, interposed between the gate electrode and the trench sidewalls.

A RG-TFT and corresponding fabrication process have been provided. Specific materials and process steps have been given as examples to illustrate the invention. However, the invention is not limited to merely these examples. Other variations and embodiments of the invention will occur to those skilled in the art.

We claim:

1. A method for fabricating a recessed-gate thin-film transistor (RG-TFT) with a self-aligned lightly doped drain (LDD), the method comprising:

depositing an insulator overlying a substrate;

etching a trench in the insulator, having a bottom and sidewalls;

forming an active silicon (Si) layer overlying the insulator and trench;

forming a gate oxide layer overlying the active Si layer;

forming a recessed gate electrode in the trench overlying the gate oxide layer;

doping the TFT; and, in response to the doping, forming LDD regions in the active Si layer overlying the trench sidewalls, each LDD region having a length that extends from a top of the trench sidewall, to the trench bottom.

2. The method of claim 1 wherein forming the insulator includes forming a silicon dioxide layer with a thickness overlying a silicon nitride layer;

wherein etching the trench in the insulator includes etching the trench through the silicon dioxide, stopping at the silicon nitride; and, wherein forming the LDD regions includes forming LDD regions with a length responsive to the silicon dioxide thickness.

3. The method of claim 1 wherein forming LDD regions includes forming LDD regions with a doping density that decreases in response to the LDD length.

4. The method of claim 3 wherein forming the active Si layer includes depositing an active Si layer overlying the insulator, adjacent the LDD regions; and, the method further comprising:

simultaneous with forming the LDD regions, forming source/drain (S/D) regions in the active Si layer adjacent the LDD regions, in response to doping the TFT.

5. The method of claim 4 wherein forming S/D regions includes forming S/D regions having a doping density greater LDD region doping density.

6. The method of claim 1 the method further comprising:

simultaneous with forming the LDD regions, forming a channel region in the active Si layer overlying the trench bottom in response to the doping.

7. The method of claim 1 wherein forming the insulator includes forming an insulator selected from a group consisting of silicon dioxide, a silicon dioxide/silicon nitride stack, and a high-k dielectric.

8. The method of claim 1 wherein etching the trench includes:

forming a photoresist layer overlying the insulator;

forming a pattern in the photoresist having a first width;

etching a trench having the first width in response to the pattern;

the method further comprising:

prior to forming the active Si layer, forming a bottom insulator layer; and, in response to the bottom insulation layer, forming a trench second width, smaller than the first width.

9. The method of claim 8 wherein etching the trench includes etching a trench having the first width at the trench bottom and a third width, greater than the first width, between tops of the trench sidewalls.

10. The method of claim 1 wherein doping the TFT includes a first implantation of dopant using a first energy;

the method further comprising:

forming S/D regions in response to the first implantation;

wherein doping the TFT includes a second implantation of dopant using a second energy, greater than the first energy; and, wherein forming the LDD regions includes forming LDD regions in response to the second implantation.

11. A method for fabricating a thin-film transistor (TFT) with a single step of dopant implantation, the method comprising:

etching a trench in an insulator;

forming an active silicon (Si) layer overlying the insulator and trench;

forming a gate oxide layer overlying the active Si layer;

forming a gate electrode in the trench overlying the gate oxide layer;

in a single implantation step, doping the TFT; and, in response to the doping, simultaneously forming heavily doped source/drain (S/D), lightly doped drain (LDD), and intrinsic channel regions.

12. The method of claim 11 wherein etching the trench includes forming a trench having sidewalls and a bottom; and, wherein forming the channel includes forming a channel in the active Si layer, interposed between the gate electrode and the trench bottom.

13. The method of claim 12 wherein forming the LDD regions includes forming LDD regions in the active Si layer, interposed between the gate electrode and the trench sidewalls.

14. The method of claim 11 wherein forming the gate electrode includes forming a polycrystalline Si gate electrode; and, wherein simultaneously forming channel, S/D, and LDD regions includes simultaneously doping the gate electrode while forming the channel, S/D, and LDD regions.

* * * * *